US006242285B1

United States Patent
Kang

(10) Patent No.: US 6,242,285 B1
(45) Date of Patent: *Jun. 5, 2001

(54) STACKED PACKAGE OF SEMICONDUCTOR PACKAGE UNITS VIA DIRECT CONNECTION BETWEEN LEADS AND STACKING METHOD THEREFOR

(76) Inventor: Kyung Suk Kang, A-302, Changmi-oneroom, 331, Yangji-ri, Yangji-myon, Yongin-city Kyungki-do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/232,026

(22) Filed: Jan. 15, 1999

(30) Foreign Application Priority Data

| Jul. 23, 1998 | (KR) | 98-29723 |
|---|---|---|
| Sep. 4, 1998 | (KR) | 98-36556 |
| Sep. 15, 1998 | (KE) | 98-37974 |
| Sep. 18, 1998 | (KR) | 98-38739 |
| Oct. 22, 1998 | (KR) | 98-44335 |

(51) Int. Cl.[7] ................ H01L 21/44; H01L 21/48; H01L 21/50; H01L 23/34; H01L 23/48
(52) U.S. Cl. .................... 438/109; 257/723; 257/777
(58) Field of Search .................... 257/686, 688, 257/678, 777, 734, 723; 361/735, 729, 728, 601, 600; 438/109, 107, 106

(56) References Cited

U.S. PATENT DOCUMENTS

| Re. 36,229 | 6/1999 | Cady . |
|---|---|---|
| 4,956,694 | 9/1990 | Eide . |
| 5,138,438 | * 8/1992 | Masayuki et al. ............ 357/75 |
| 5,221,642 | 6/1993 | Burns . |
| 5,236,117 | 8/1993 | Roane et al. . |
| 5,279,029 | 1/1994 | Burns . |
| 5,313,096 | 5/1994 | Eide . |
| 5,332,922 | * 7/1994 | Oguchi et al. ............ 257/723 |
| 5,367,766 | 11/1994 | Burns et al. . |
| 5,369,056 | 11/1994 | Burns et al. . |

(List continued on next page.)

Primary Examiner—Tuan H. Nguyen
Assistant Examiner—Nema Berezny
(74) Attorney, Agent, or Firm—F. Chau & Associates, LLP

(57) ABSTRACT

A stacked package of semiconductor package units and a stacking method thereof through direct connection between leads to effectively stack a number of semiconductor packages are provided, in which a lead deformation process of straightening leads of an upper semiconductor package is performed to form a stacked package, and predetermined leads of the semiconductor packages above a lower semiconductor package being a conventional standard semiconductor package are directly connected, considering an external and internal electrical connection state of a package. The semiconductor packages are used for forming a stacked package through directly connecting predetermined leads of the semiconductor packages, in which a connection state between a CS lead of an operation select-function for activating the operation of a predetermined semiconductor package and any one NC lead of a number of NC leads which are not connected is changed externally and internally in a package. The volume of the stacked package is reduced half to thereby minimize a surface mounting area of the stacked package. A stacking processes are simplified by solving the conventional complicated problems. Also, one testing equipment can test semiconductor packages which are used for the stacked packages of the present invention, because the outside shape of the unit packages is identical prior to the lead deformation. Thus, costs are not only saved but also a number of semiconductor packages can be efficiently stacked.

10 Claims, 16 Drawing Sheets

U.S. PATENT DOCUMENTS

| | | |
|---|---|---|
| 5,369,058 | 11/1994 | Burns et al. . |
| 5,371,866 | 12/1994 | Cady . |
| 5,377,077 | 12/1994 | Burns . |
| 5,420,751 | 5/1995 | Burns . |
| 5,446,620 | 8/1995 | Burns et al. . |
| 5,448,450 | 9/1995 | Burns . |
| 5,455,740 | 10/1995 | Burns . |
| 5,479,318 | 12/1995 | Burns . |
| 5,484,959 | 1/1996 | Burns . |
| 5,493,476 | 2/1996 | Burns . |
| 5,498,906 | 3/1996 | Roane et al. . |
| 5,499,160 | 3/1996 | Burns . |
| 5,512,783 * | 4/1996 | Wakefield ............................ 257/693 |
| 5,528,075 | 6/1996 | Burns . |
| 5,543,664 | 8/1996 | Burns et al. . |
| 5,550,711 | 8/1996 | Burns et al. . |
| 5,552,963 | 9/1996 | Burns . |
| 5,561,591 | 10/1996 | Burns . |
| 5,566,051 | 10/1996 | Burns . |
| 5,572,065 | 11/1996 | Burns . |
| 5,581,121 | 12/1996 | Burns et al. . |
| 5,585,668 | 12/1996 | Burns . |
| 5,586,009 | 12/1996 | Burns . |
| 5,588,205 | 12/1996 | Roane . |
| 5,592,364 | 1/1997 | Roane . |
| 5,605,592 | 2/1997 | Burns . |
| 5,612,570 | 3/1997 | Eide et al. . |
| 5,615,475 | 4/1997 | Burns . |
| 5,631,193 | 5/1997 | Burns . |
| 5,654,877 | 8/1997 | Burns . |
| 5,702,985 | 12/1997 | Burns . |
| 5,778,522 | 7/1998 | Burns . |
| 5,783,464 | 7/1998 | Burns . |
| 5,801,437 | 9/1998 | Burns . |
| 5,804,870 | 9/1998 | Burns . |
| 5,811,877 * | 9/1998 | Miyano et al. ...................... 257/706 |
| 5,828,125 | 10/1998 | Burns . |
| 5,843,807 | 12/1998 | Burns . |
| 5,864,175 | 1/1999 | Burns . |
| 5,869,353 | 2/1999 | Levy et al. . |
| 5,895,232 | 4/1999 | Burns . |
| 5,945,732 | 8/1999 | Burns . |

* cited by examiner

| Left | Pin | | Pin | Right |
|---|---|---|---|---|
| V$_{DD}$ | 1 | | 54 | V$_{SS}$ |
| NC | 2 | | 53 | NC |
| V$_{DDQ}$ | 3 | | 52 | V$_{SSQ}$ |
| NC | 4 | | 51 | NC |
| DQ0 | 5 | | 50 | DQ3 |
| V$_{SSQ}$ | 6 | | 49 | V$_{DDQ}$ |
| NC | 7 | | 48 | NC |
| NC | 8 | | 47 | NC |
| V$_{DDQ}$ | 9 | | 46 | V$_{SSQ}$ |
| NC | 10 | | 45 | NC |
| DQ1 | 11 | 64M SDRAM | 44 | DQ2 |
| V$_{SSQ}$ | 12 | | 43 | V$_{DDQ}$ |
| NC | 13 | | 42 | NC |
| V$_{DD}$ | 14 | | 41 | V$_{SS}$ |
| NC | 15 | | 40 | NC |
| /WE | 16 | | 39 | DQM |
| /CAS | 17 | | 38 | CLK |
| /RAS | 18 | | 37 | CLE |
| /CS | 19 | | 36 | NC |
| A13 | 20 | | 35 | A11 |
| A12 | 21 | | 34 | A9 |
| A10 | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| V$_{DD}$ | 27 | | 28 | V$_{SS}$ |

| Pin | Signal | | Pin | Signal |
|---|---|---|---|---|
| 1 | V$_{DD}$ | | 54 | V$_{SS}$ |
| 2 | NC | | 53 | NC |
| 3 | V$_{DDQ}$ | | 52 | V$_{SSQ}$ |
| 4 | NC | | 51 | NC |
| 5 | DQ0 | | 50 | DQ3 |
| 6 | V$_{SSQ}$ | | 49 | V$_{DDQ}$ |
| 7 | NC | | 48 | NC |
| 8 | NC | | 47 | NC |
| 9 | V$_{DDQ}$ | | 46 | V$_{SSQ}$ |
| 10 | NC | | 45 | NC |
| 11 | DQ1 | | 44 | DQ2 |
| 12 | V$_{SSQ}$ | | 43 | V$_{DDQ}$ |
| 13 | NC | | 42 | NC |
| 14 | V$_{DD}$ | | 41 | V$_{SS}$ |
| 15 | /CS | | 40 | NC |
| 16 | /WE | | 39 | DQM |
| 17 | /CAS | | 38 | CLK |
| 18 | /RAS | | 37 | CLE |
| 19 | NC | | 36 | NC |
| 20 | A13 | | 35 | A11 |
| 21 | A12 | | 34 | A9 |
| 22 | A10 | | 33 | A8 |
| 23 | A0 | | 32 | A7 |
| 24 | A1 | | 31 | A6 |
| 25 | A2 | | 30 | A5 |
| 26 | A3 | | 29 | A4 |
| 27 | V$_{DD}$ | | 28 | V$_{SS}$ |

64M SDRAM

| Left | Pin | | Pin | Right |
|---|---|---|---|---|
| $V_{DD}$ | 1 | | 54 | $V_{SS}$ |
| NC | 2 | | 53 | NC |
| $V_{DDQ}$ | 3 | | 52 | $V_{SSQ}$ |
| NC | 4 | | 51 | NC |
| DQ0 | 5 | | 50 | DQ3 |
| $V_{SSQ}$ | 6 | | 49 | $V_{DDQ}$ |
| NC | 7 | | 48 | NC |
| NC | 8 | | 47 | NC |
| $V_{DDQ}$ | 9 | | 46 | $V_{SSQ}$ |
| NC | 10 | | 45 | NC |
| DQ1 | 11 | | 44 | DQ2 |
| $V_{SSQ}$ | 12 | | 43 | $V_{DDQ}$ |
| NC | 13 | | 42 | NC |
| $V_{DD}$ | 14 | | 41 | $V_{SS}$ |
| /CS(NC) | 15 | | 40 | NC |
| /WE | 16 | | 39 | DQM |
| /CAS | 17 | | 38 | CLK |
| /RAS | 18 | | 37 | CLE |
| EXTERNAL NC(/CS) | 19 | | 36 | NC |
| A13 | 20 | | 35 | A11 |
| A12 | 21 | | 34 | A9 |
| A10 | 22 | | 33 | A8 |
| A0 | 23 | | 32 | A7 |
| A1 | 24 | | 31 | A6 |
| A2 | 25 | | 30 | A5 |
| A3 | 26 | | 29 | A4 |
| $V_{DD}$ | 27 | | 28 | $V_{SS}$ |

STACKED PACKAGE OF SEMICONDUCTOR PACKAGE UNITS VIA DIRECT CONNECTION BETWEEN LEADS AND STACKING METHOD THEREFOR

BACKGROUND OF THE INVENTION

1. Field of the Invention

The present invention relates to a stacked package of semiconductor package units and a manufacturing method therefor in which a number of semiconductor package units can be stacked, and more particularly, to a stacked package of semiconductor package units and a stacking method therefor, in which a number of semiconductor packages can be efficiently stacked, by directly connecting respective leads of upper and lower semiconductor packages forming the stacked package with one another, without using separate means for connecting respective leads of the semiconductor packages with one another.

2. Description of the Related Art

Most of devices include semiconductor packages performing a variety of functions to form an circuit. In general, the semiconductor packages are surface-mounted on a printed circuit board (PCB) by the piece. However, since various devices become compact with the development of technologies, and a demand for miniaturization also increases, technologies of mounting a number of components on a unit surface, among which a stack packaging technology for mounting a number of semiconductor packages on an identical area and improving an efficiency of mounting the semiconductor packages is particularly swiftly developed and approaches to an practical stage.

A conventional technology for a stacked package will be described with reference to FIGS. 1A and 1B. FIG. 1A is a perspective view of a conventional stacked package and FIG. 1B is a cross-sectional view taken along a line r–r' of FIG. 1A.

As depicted, a conventional stacked package is formed by electrical connection between a number of leads (which are called pins) of respective semiconductor packages $IC_A$ and $IC_B$ to be connected to each other using separate auxiliary means which are called headers H1–H20 in which two semiconductor packages $IC_A$ and $IC_B$ are located in the upper portion and the lower portion, respectively, that is, one on top of the other so that the respective leads face one another. For the operation of the respective semiconductor packages $IC_A$ and $IC_B$ forming a stacked package, when a connection between leads $P19_A$ and $P19_B$ of the semiconductor packages $IC_A$ and $IC_B$ should be blocked like a H19 header, an intermediate portion of the header H19 is cut and the remaining portion of the header H19 transverses the upper portion of the stacked package, to be connected to opposite desired leads. By doing so, in the case that a semiconductor package unit is a 64M synchronous dynamic random access memory (SDRAM), a stacked package having a capacity of 128M SDRAM is formed on the similar mounting area using two semiconductor packages $IC_A$ and $IC_B$.

However, the above conventional stacked package should contain a number of headers H1–H20 as many as the number corresponding to a number of leads for electrical connection between the corresponding leads, and removes an inter-lead connection portion in the H19 header for electrical disconnection between particular leads. As a pitch between leads, that is, an interval between adjacent two leads becomes narrow with the development of technology, it is difficult and inconvenient to form a stacked package. Moreover, there is a problem that a parasitic capacitance and impedance increase due to headers, so that such an increase influences an operational frequency of the stacked package.

Also, since headers are attached at the state where leads of the semiconductor packages $IC_A$ and $IC_B$ are deformed in shape in the conventional stacked package, as shown in FIG. 1A, after being fabricated in the form of a package, the width of the completed stack package becomes larger than that of a package unit, to thereby cause a mounting area to increase.

SUMMARY OF THE INVENTION

To solve the above problems, it is an object of the present invention to provide a stacked package of semiconductor package units via direct connection between leads in which a number of semiconductor packages can be efficiently stacked, by directly connecting between predetermined leads of semiconductor packages forming the stacked package, so as to be stacked, without using separate means such as conventional headers for connecting between respective leads of semiconductor packages, but using semiconductor packages whose connection structure between a CS(Chip Selection) lead having an select-function for selecting the operations of predetermined semiconductor packages internally and externally and an NC(No-Connected) lead among a number of NC leads, is varied.

It is another object of the present invention to provide a stack method for stacking semiconductor package units in which a number of semiconductor packages can be efficiently stacked, by directly connecting between respective leads of semiconductor packages except for predetermined leads, at the state where the leads of the semiconductor package completed in the form of a package are deformed for stacking easily, and simultaneously electrical connection is formed between particular leads, considering a changed state after changing a CS lead connection with respect to an inner die before or after the semiconductor package units have been completed in the form of a package.

To accomplish the above object of the present invention, there is provided a stacked package of semiconductor package units having a first semiconductor package and at least one second semiconductor package stacked on top of the first semiconductor package, the stacked package characterized in that the first semiconductor package comprises a number of first leads having at least one first chip selection lead for connecting the stacked package to an external circuit; and the second semiconductor package comprises a number of second leads having at least one second chip selection lead corresponding to a number of leads of the first semiconductor package, wherein predetermined second leads of the second semiconductor package are directly connected to the first leads of the first semiconductor package while the respective CS leads of the first and second packages being electrically disconnected to each other.

There is also provided a stack method for stacking semiconductor package units through direct connection between leads, the stack method comprising the steps of: (a) fabricating semiconductor packages in the form of a package; (b) deforming a number of leads included in a predetermined number of the semiconductor packages fabricated in step (a), so as to be easily stacked; and (c) directly connecting a number of first leads of the first semiconductor package fabricated in step (a) in correspondence to predetermined second leads of at least one second semiconductor package in which a number of second leads are deformed in step (b).

BRIEF DESCRIPTION OF THE DRAWINGS

The above objects and other advantages of the present invention will become more apparent by describing the preferred embodiments thereof in more detail with reference to the accompanying drawings in which:

FIGS. 2A to 2E show a stacked package formed of semiconductor packages in which a connection state of a bonding wire connected to an inner die is changed before being completed in the form of a package, according to an embodiment of the present invention;

FIGS. 4A to 4E show a stacked package formed of semiconductor packages whose connection structure is changed using an additional wire bonding or a particular lead frame after a conventional wire bonding, according to another embodiment of the present invention;

DETAILED DESCRIPTION OF THE PREFERRED EMBODIMENTS

Figure 1A:
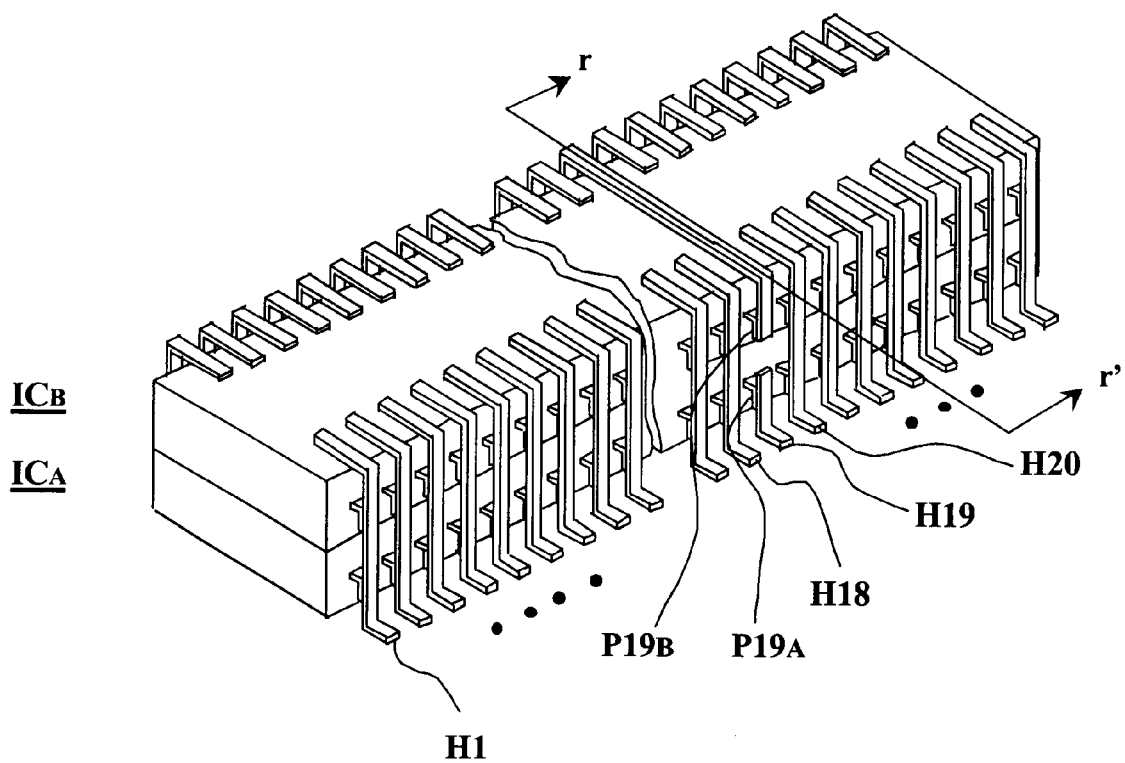
FIG. 1A. is a perspective view of a conventional stacked package.
Figure 1B:
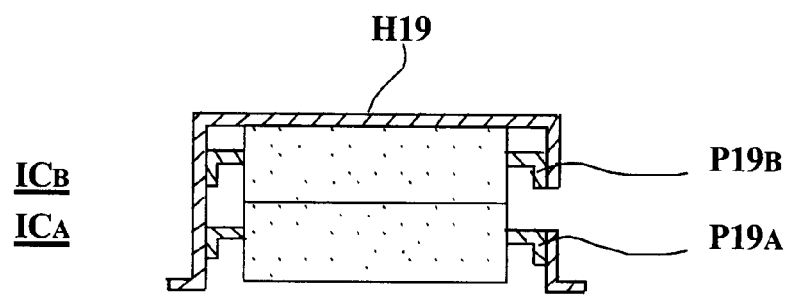
FIG. 1B is a cross-sectional view taken along a line r–r' of FIG. 1A.

Preferred embodiments of the present invention will be described with reference to the accompanying drawings.

In the present invention, respective leads are directly connected in correspondence to upper and lower semiconductor packages forming a stacked package. That is, though the above-described conventional stacked package uses a separate connection means such as headers for electrical connection between respective leads of upper and lower semiconductor packages, the stacked package of the present invention does not use a conventional separate means for connecting between the leads because respective leads of semiconductor package units are directly connected to each other. The embodiments of the present invention which will be described later use a lead connection means for electrical connection between particular leads, which is an separate means for performing a direct connection between the corresponding leads of the present invention and does not mean an separate means such as a header of the prior art.

In the stacked package of the present invention formed through a direct connection between leads, a connection structure between particular leads is changed internally and externally with respect to the semiconductor package, so that a chip-selection (CS) lead for performing a CS function of each semiconductor package forming the stacked package is positioned at a respectively different position, for an operation of a completed stack package. Also, for the operation of the stacked package according to the present invention, the length of a CS lead of the upper semiconductor package is unchanged or shortened considering a CS lead connection structure of each semiconductor package, and a connection structure of a CS lead is changed for a stack using a lead-connection means for connecting particular leads as required.

Various embodiments of the present invention to be described later, are largely divided into stack packages stacked with semiconductor packages in which a connection structure of a bonding wire connected to an inner die is changed before being completed in the form of a package, and stacked packages in which a lead connection state of semiconductor package units whose connection state of the bonding wire of an inner die is externally changed and then the changed semiconductor package units are stacked. In each embodiment, the upper semiconductor package performs a modified process for straightening a number of leads so that a stacked package is formed by directly connecting between respective leads of a first and second semiconductor packages without using separate means such as headers for connecting between the respective leads.

Preferred embodiments of the present invention will be described with reference to the accompanying drawings.

FIGS. 2A to 2E show a stacked package formed of semiconductor packages in which a connection structure of a bonding wire connected to an inner die is deformed before being completed in the form of a package, according to an embodiment of the present invention. In this invention, a stacked package formed of two 64M SDRAM having 54 leads (or pins) will be described as an example.

Figure 2A:
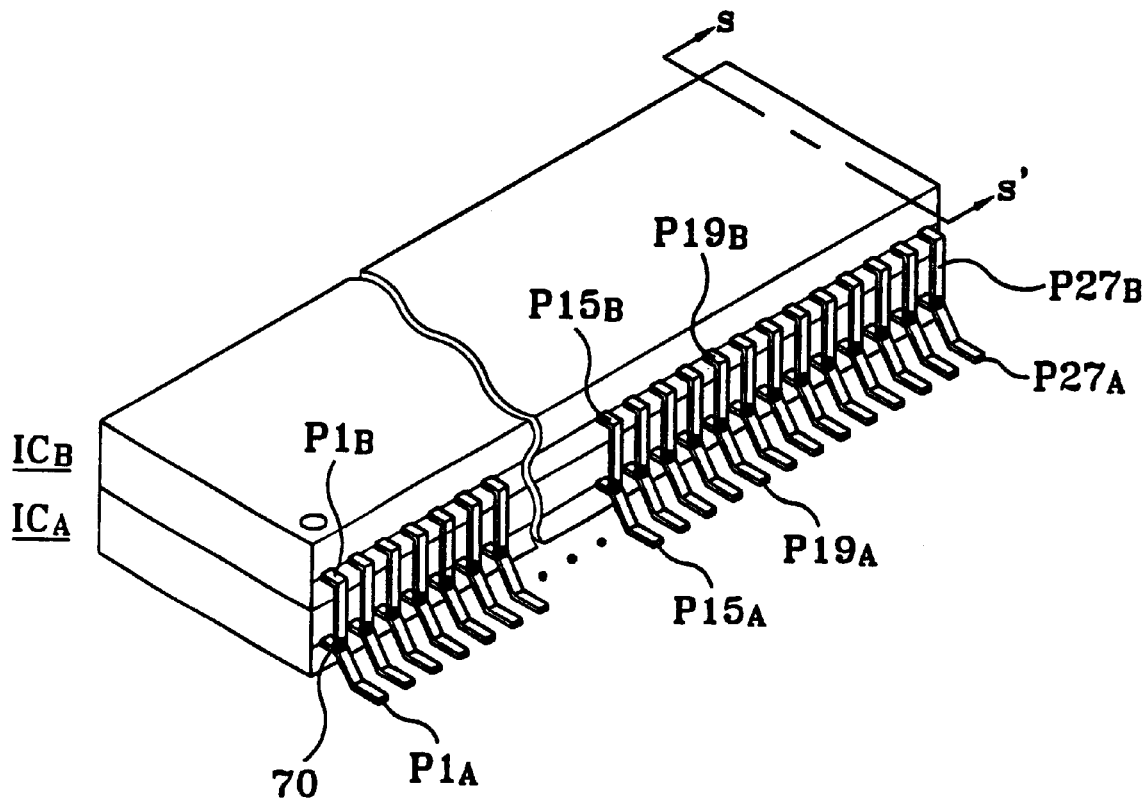
Figure 2B:
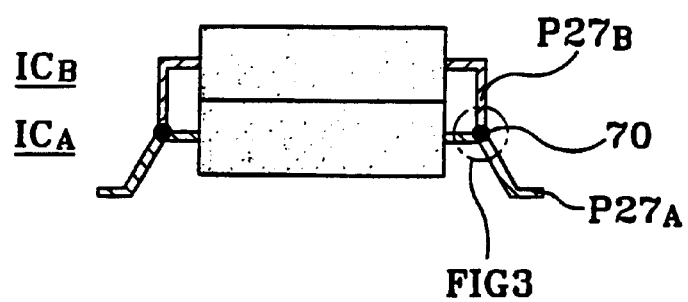

FIG. 2A is a perspective view of a stacked package formed according to a connection change of a bonding wire in an inner die, and FIG. 2B is a cross- sectional view of the stacked package of FIG. 2A taken along a line s–s'.

As shown in FIGS. 2A and 2B, respective leads $P1_B$ through $P27_B$ of an upper semiconductor package $IC_B$ are soldered to respectively corresponding leads $P1_A$ through $P27_A$ of a lower semiconductor package $IC_A$ as depicted as a reference numeral 70. That is, the respective leads are directly connected to form a stacked package. In the stacked package according to the present embodiment, at the time when the upper semiconductor package $IC_B$ is completed in the form of a package, the leads $P1_B$ through $P27_B$ of the upper semiconductor package $IC_B$ have the same patterns as those of the lower semiconductor package $IC_A$. However, to form a stacked package, the leads $P1_B$ through $P27_B$ of the upper semiconductor package $IC_B$ are deformed in the shape of an approximately conventional DIP (Dual Inline Package) lead.

FIG. 2C shows functions of the respective leads of a conventional 64M SDRAM which is located at the lowermost portion of the stacked package according to the present invention, which is usually mounted on a PCB for mounting the stacked package thereon.

As shown, 54 leads 1–54 of the semiconductor package $IC_A$ which is located in the lower portion of the stacked package consist of 14 address leads A0–A13, 4 data leads DQ0–DQ3, 15 NC (No Connection) leads disconnected with an inner die (inner integrated circuit in die) of the semiconductor package, and a number of control leads. The address leads A0–A13 are leads for designating addresses of a memory. The data leads DQ0–DQ13 are leads for transferring data. A CLK lead 38 is a lead for applying a clock signal. A WE (Write Enable) lead 16 is a lead for allowing data to be stored. A CLE (Clock Enable) lead 37 is a lead for controlling the clock signal to be applied to the inner die (referring to $100_B$ in FIG. 2E) of the semiconductor package.

FIG. 2D shows functions of the respective leads of the upper semiconductor package $IC_B$ which is located at the upper portion of the stacked package according to the present invention. Compared with the lower semiconductor package $IC_A$ of FIG. 2C, the functions of the respective leads of the upper semiconductor package $IC_B$ of FIG. 2D are the same as those of FIG. 2C, except for the 15th and 19th leads. That is, a CS (chip selection) function is performed by the 19th lead in the lower semiconductor package $IC_A$ of FIG. 2C, while the CS function is performed by the 15th lead in the upper semiconductor package $IC_B$ of FIG. 2D.

Figure 2E:
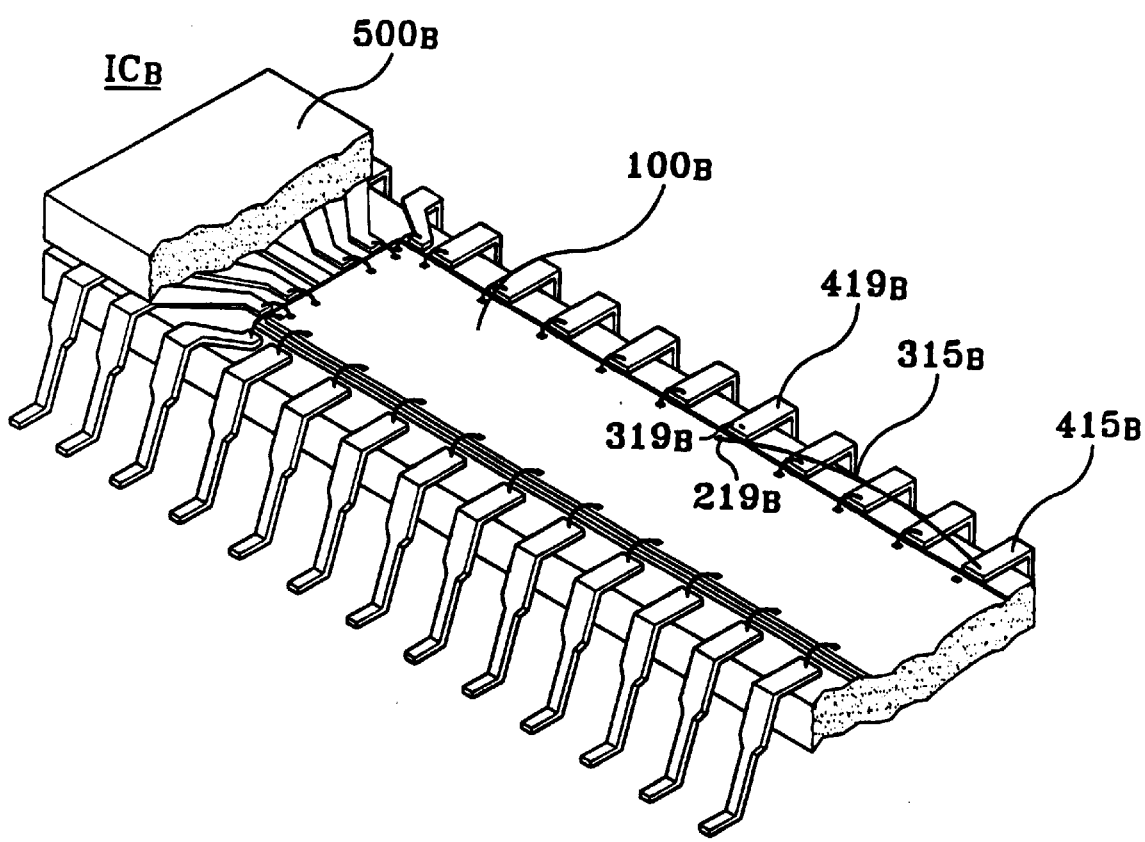

FIG. 2E shows an wire bonding process and state of the upper semiconductor package $IC_B$ of FIG. 2D. As shown, the upper semiconductor package $IC_B$ includes a die $100_B$ in which a circuit having a special function which is performed only in the corresponding semiconductor package $IC_B$ is integrated. Also, the semiconductor package $IC_B$ includes a number of leads containing $415_B$ and $419_B$ (which is called a lead frame) for connecting between the corresponding semiconductor package and an external circuit. The bonding wires containing $315_B$ and $319_B$ connect die $100_B$ with leads containing $415_B$ and $419_B$. Finally, a molding compound $500_B$ completes an external shape of a semiconductor package by molding inner connection portions of the semiconductor integrated circuit die $100_B$, the bonding wires containing $315_B$ and $319_B$, and the respective leads $415_B$ and $419_B$ and is a material for protecting each components. A number of pads containing $219_B$ for wire-bonding the die $100_B$ and the leads containing $415_B$ and $419_B$ are located in the die $100_B$.

To form the stacked package shown in FIG. 2A, in the upper semiconductor package $IC_B$ shown in FIG. 2E a lead $415_B$ is connected to a CS pad $219_B$ which performs a CS function, with a bonding-wire $315_B$. The lead $415_B$ becomes a CS lead $415_B$ having a CS function for activating the die $100_B$ to be able to operate. However, in the lower semiconductor package $IC_A$ as shown in FIG. 2C which is fabricated by a conventional process, a CS pad $219_B$ for activating an operation of the semiconductor package (or an inner die of the semiconductor package) is connected to a lead $419_B$ via a bonding wire $319_B$. Thus, in the upper semiconductor package $IC_B$, the CS pad $219_B$ is connected to a $415_B$ lead. In the lower semiconductor package $IC_A$ according to this embodiment, the CS pad $219_B$ is connected to the $419_B$ lead. As will be described later with reference to FIGS. 4C and 4D, a stacked package can be formed using semiconductor packages in which a number of pads are located at the center portion of the die $100_B$ differently from this embodiment. In this case, bonding-wires of a umber of leads are located and connected at the center portion of the die $100_B$.

As shown in FIGS. 2A through 2E, a number of leads $P1_A$–$P27_A$ and $P1_B$–$P27_B$ of the two semiconductor packages $IC_A$ and $IC_B$ forming a stacked package are electrically connected to each other, so that the same signal is applied thereto. Also, a signal appropriate for a function of a corresponding lead is applied to each of the leads $P1_A$–$P27_A$ and $P1_B$–$P27_B$ but a CS signal for activating each of the stacked semiconductor package is applied to the 19th leads $P19_A$ and $P19_B$ and the 15th leads $P15_A$ and $P15_B$. As described above, the NC leads represent that they are not connected to the inner die of the semiconductor package. The CS lead is a lead for activating each of the semiconductor package units. Thus, only when a CS signal is applied to the CS lead of each semiconductor package $IC_A$ or $IC_B$, a corresponding semiconductor package are activated. Thus, if a CS signal is applied to the 19th leads $P19_A$ and $P19_B$, the CS signal activates the lower semiconductor package ICA. If a CS signal is applied to the 15th leads $P15_A$ and $P15_B$, the CS signal activates the upper semiconductor package $IC_B$. Also, since the position of the lead which substantially performs the CS function differs from each other, the positions of the upper semiconductor package $IC_B$ and lower semiconductor package $IC_A$ may be changed to form a stacked package.

Figure 3:
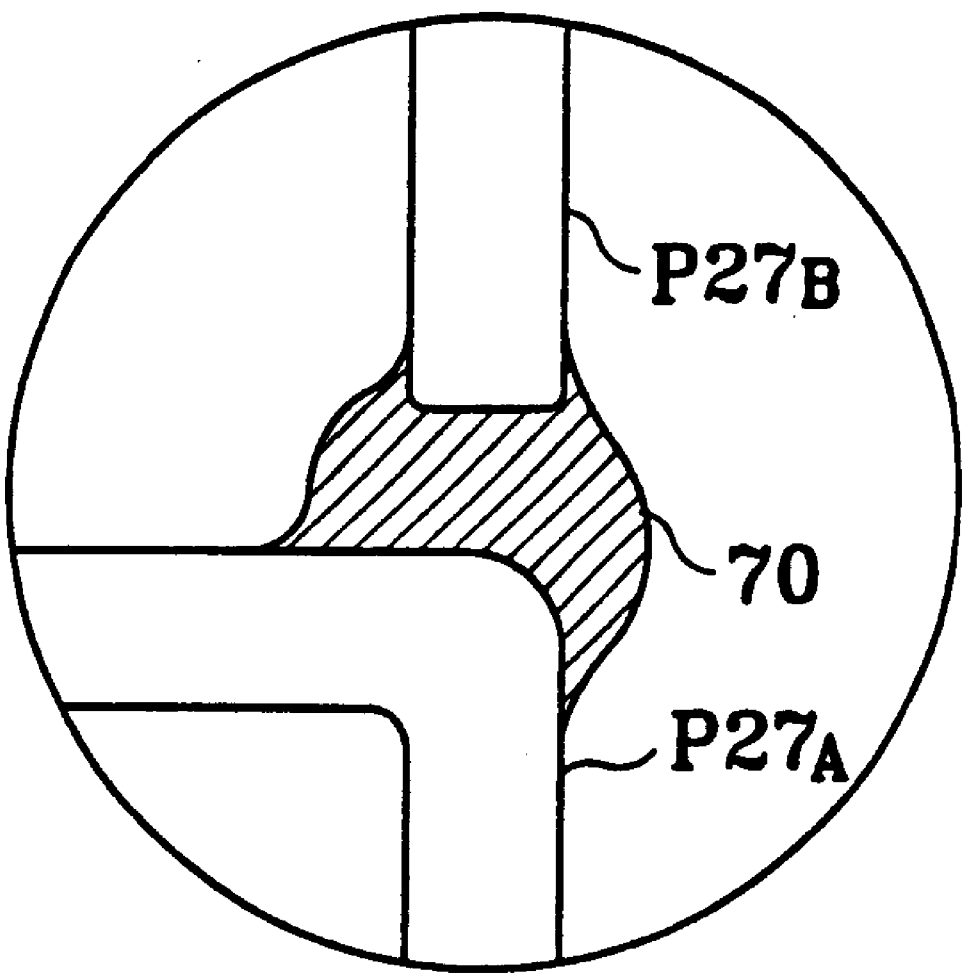
FIG. 3 is a detailed view of a connection portion between respective leads of the upper and lower semiconductor packages in the stacked package.

FIG. 3 is a view for explaining a stacked process in detail by connecting respective leads of the upper and lower semiconductor packages in the stacked package, which is an enlarged view of a dotted circle of FIG. 2B. $P27_A$ is a lead of the lower semiconductor package $IC_A$ and $P27_B$ is a lead end portion of the upper semiconductor package $IC_B$. A reference numeral 70 is a connection means for connecting the upper and lower semiconductor packages $IC_B$ and $IC_A$.

As depicted, the leads $P27_A$ and $P27_B$ of the upper and lower semiconductor packages $IC_B$ and $IC_A$ are connected by a soldering in which a conductive material having a good conductivity is used as a soldering material. When soldering, when a spacing between the two leads $P27_A$ and $P27_B$ is a minimum distance, e.g. about 0.3 mm or less, the soldered material under the influence of a surface tension force and so forth forms a connection ball naturally. The connection ball produced at the natural state is good in its connection state and has a good conductivity. In a respective embodiment of the present invention, the respective leads of the upper and lower semiconductor packages which correspond to each other are directly connected by such a soldering and stacked with one on top of the other.

Figure 4A:
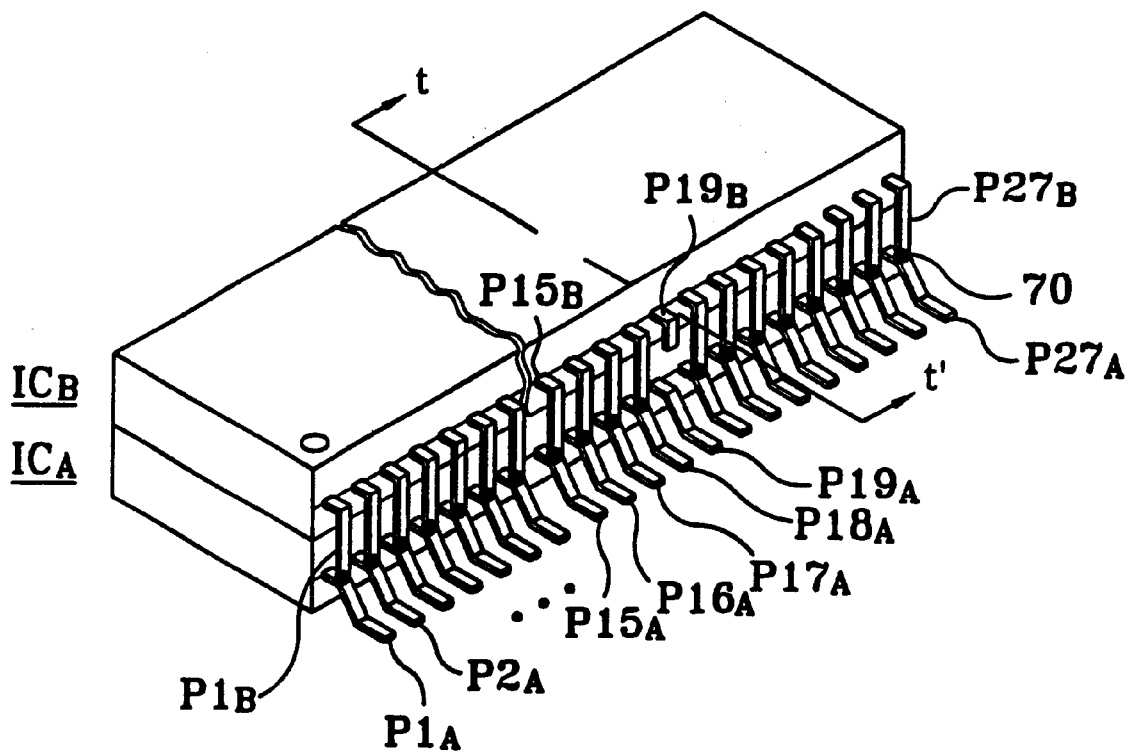
Figure 4B:
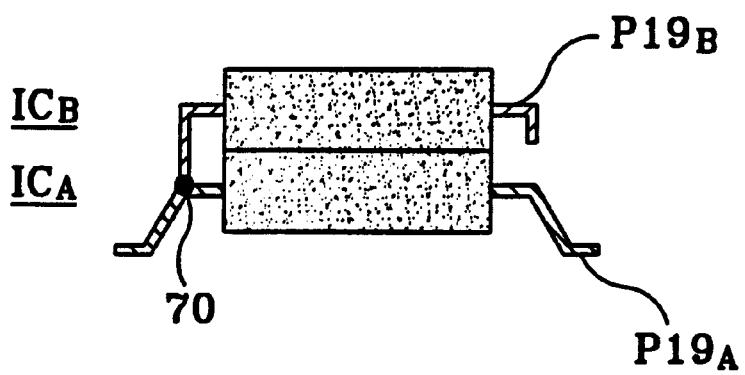

FIGS. 4A to 4E show a stacked package formed of semiconductor packages whose connection structure is deformed using an additional bonding-wire or a particular lead frame after a conventional wire-boding, prior to completing a package type. FIG. 4A is a perspective view of another stacked package in which corresponding leads are directly connected considering a connection change of a bonding wire in an inner die, and FIG. 4B is a cross-sectional view of the stacked package of FIG. 4A taken along a line t–t'.

As shown in FIGS. 4A and 4B, respective leads $P1_B$–$P18_B$ and $P20_B$–$P27_B$ of an upper semiconductor package $IC_B$ except for a CS lead $P19_B$ are soldered to respectively corresponding leads $P1_A$–$P18_A$ and $P20_A$–$P27_A$ of a lower semiconductor package $IC_A$ as depicted as a reference numeral 70. That is, the respective leads are directly connected to form a stacked package. For operation of the stacked package according to the present embodiment, the length of a CS lead $P19_B$ of the upper semiconductor package $IC_B$ is shortened to be disconnected from a CS lead $P19_A$ of the lower semiconductor package $IC_A$. The leads $P1_B$ through $P27_B$ of the upper semiconductor package $IC_B$ which are deformed in the shape of an approximately conventional DIP(Dual Inline Package)lead, are directly connected to the leads $P1_A$ through $P27_A$ of the lower semiconductor package $IC_A$.

Figure 4C:
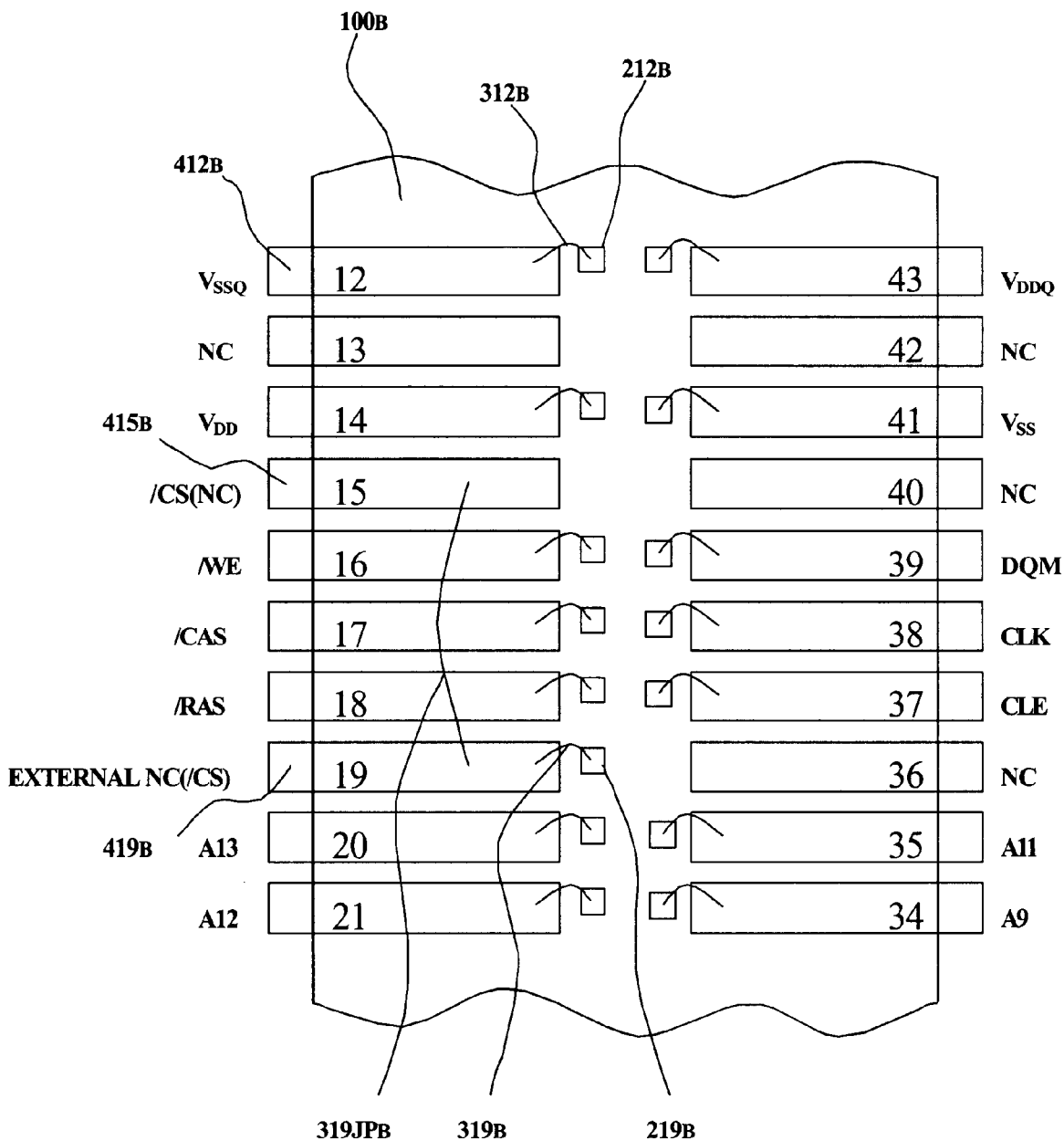
Figure 4D:
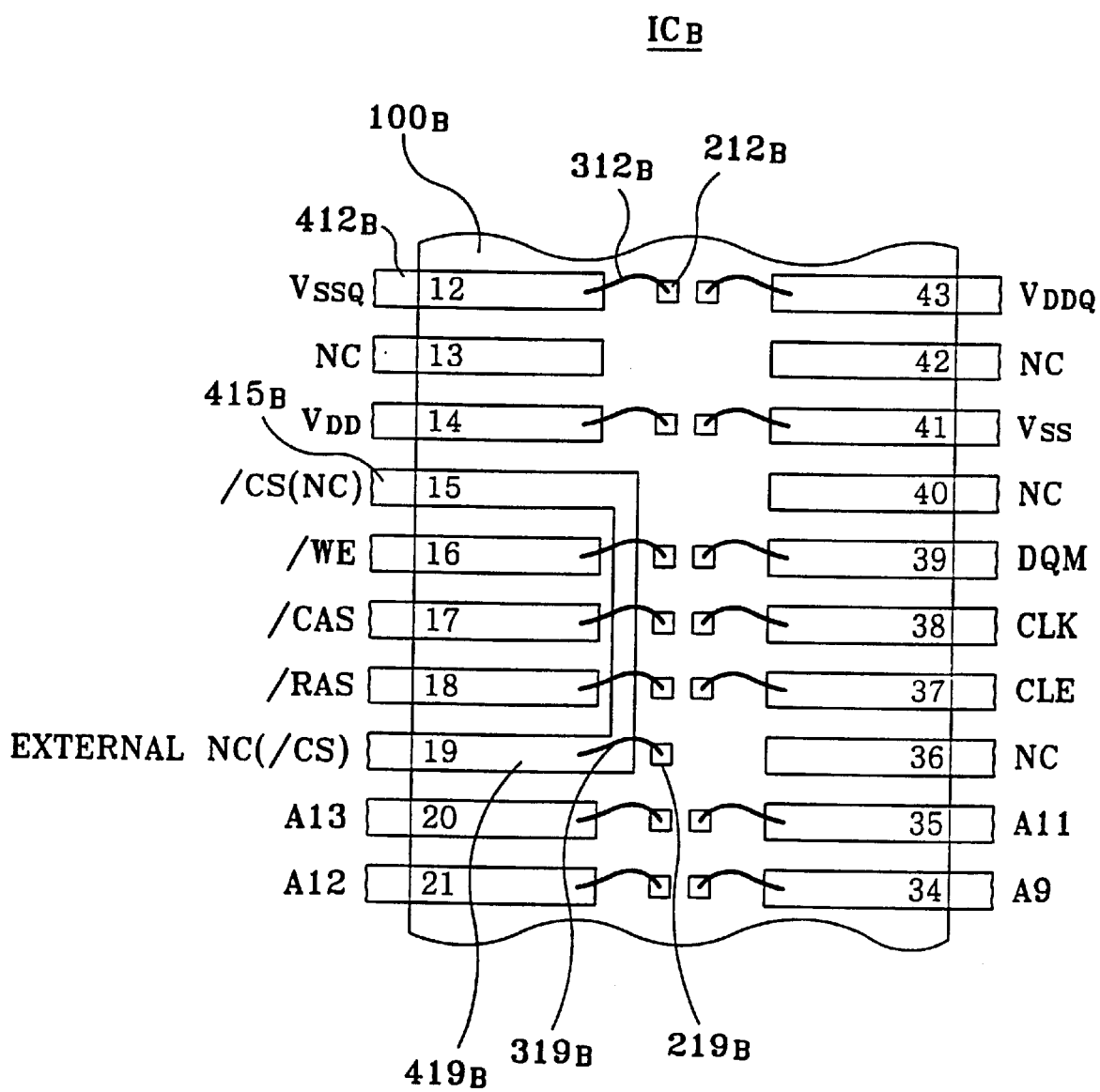

FIGS. 4C and 4D are views for explaining a change method of an inner wire bonding to form an upper semiconductor package $IC_B$. As described above, a process for changing a wire bonding at a die $100_B$ in which a number of pads are located at the center portion thereof will be described.

As shown in FIGS. 4C and 4D, a number of rectangular connection pads containing $212_B$ are located in an integrated die $100_B$ which performs a particular function of a semiconductor package. In these embodiments, before completing a package type, that is, before a molding compound $500_B$ of FIG. 2E is molded, the inner connection portion of a CS lead $419_B$ in a typical 64M SDRAM and that of a NC lead $415_B$ are electrically connected to each other to then complete a package. The outer connection portion of CS lead $419_B$ of the completed semiconductor package $IC_B$ is shortened and thus is intentionally disconnected from the outer connection portion of the CS lead $419_A$ of the lower semiconductor package $IC_A$ of FIG. 4A during a stacking process. Finally, the $415_B$ lead which was one of the NC leads of the upper semiconductor package $IC_B$ performs a CS function.

Referring to FIG. 4C, a wire-bonding process of a conventional 64M SDRAM will be described. The CS pad $219_B$ included in a die $100_B$ is connected to a $419_B$ lead via the bonding wire $319_B$, which is a wire bonding process in a conventional semiconductor package manufacturing process. Thus, the $419_B$ lead performs a CS function and the thus-fabricated semiconductor package is the lower semiconductor package $IC_A$ shown in FIG. 2C. In this embodiment, a process for wire-bonding a $419_B$ lead and a $415_B$ lead is additionally performed using a jumper wire $319JP_B$, to thereby complete a package and then perform a stacking.

Referring to FIG. 4A, the length of the outer connection portion of the $419_B$ lead is shortened and intentionally disconnected from the CS lead $419_A$ of the lower semiconductor package $IC_A$.

FIG. 4D shows a semiconductor package providing the same electrical connection effect as the FIG. 4C embodiment, in which a bonding wire 319B is performed using a special lead where an inner connection portion of a $419_B$ lead and an inner connection portion of a $415_B$ lead are connected, instead of the jumper wire $319JP_B$ shown in FIG. 4C.

FIG. 4E shows an upper semiconductor package $IC_B$ which is completed in the form of a package after a changing process in FIGS. 4C and 4D. As depicted, a 15th lead is a NC lead in a conventional 64 SDRAM, and performs a CS function according to a changing process shown in FIGS. 4C and 4D. A 19th lead is shortened in its length during a stacking process, to thus become an externally isolated "outer NC". The functions and executions of the remaining leads except for the 15th and 19th leads are the same as those of FIGS. 2C and 2D.

In the stacked package of the embodiment shown in FIGS. 4A through 4E, the 19th lead $P19_B$ of the upper semiconductor package $IC_B$ is open with the 19th lead $P19_A$ of the lower semiconductor package $IC_A$, which is a difference from the stacked package of FIGS. 2A and 2B. Although the above structural difference of the stacked package exists, the operation of the stacked package of FIGS. 4A and 4B are the same as that in the stacked package of FIGS. 2A and 2B.

An alternative embodiment of the present invention provides a stacked package for directly connecting corresponding respective leads for stacking, at the state where an outer connection portion of a CS lead is connected to an outer connection portion of a certain NC lead among a number of NC leads, using a semiconductor package unit completed in the form of a package, and the CS lead of the upper semiconductor package is disconnected with respect to the CS lead of the lower semiconductor package.

Figure 5A:
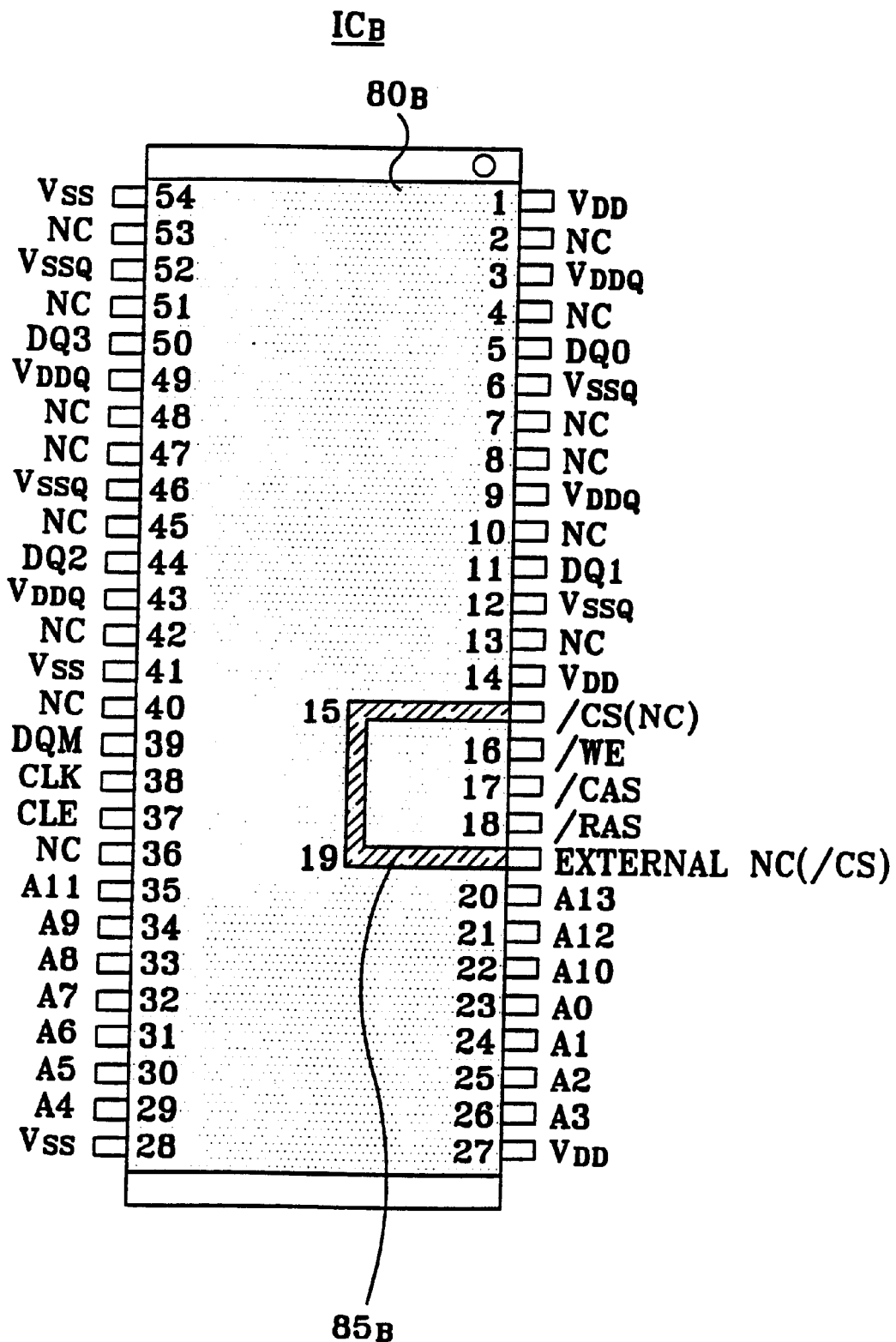
FIGS. 5A to 5C show a stacked package formed by inserting a board for connection onto the rear surface of the upper semiconductor package.
Figure 5B:
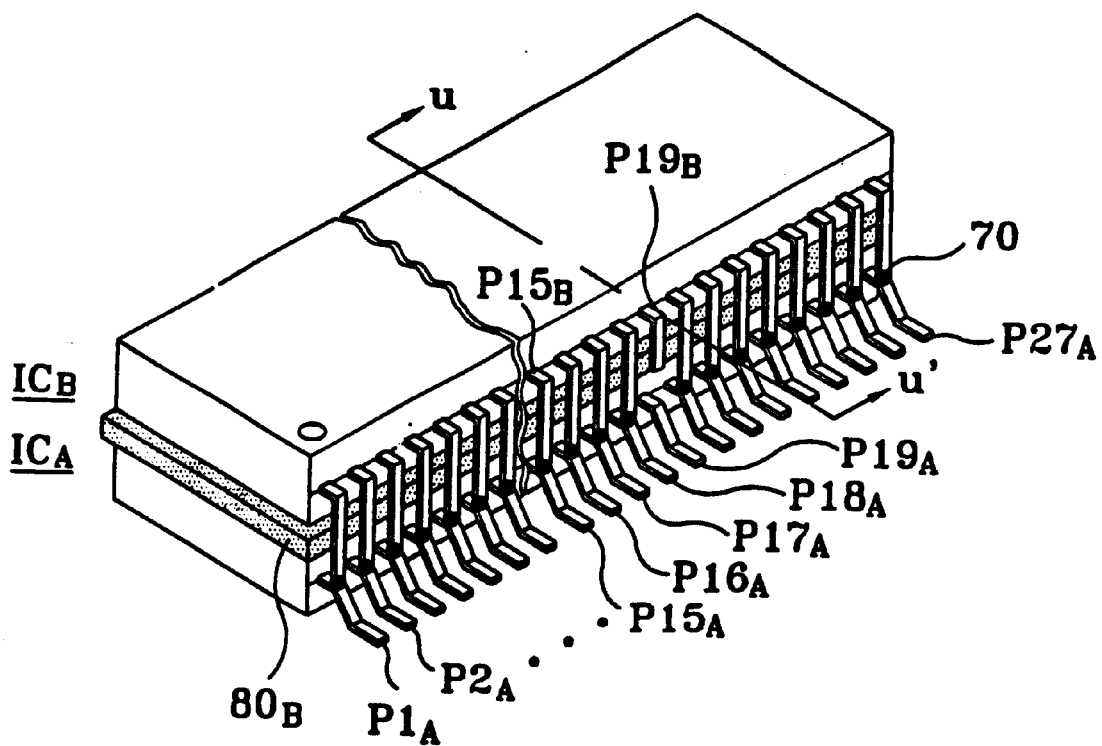
Figure 5C:
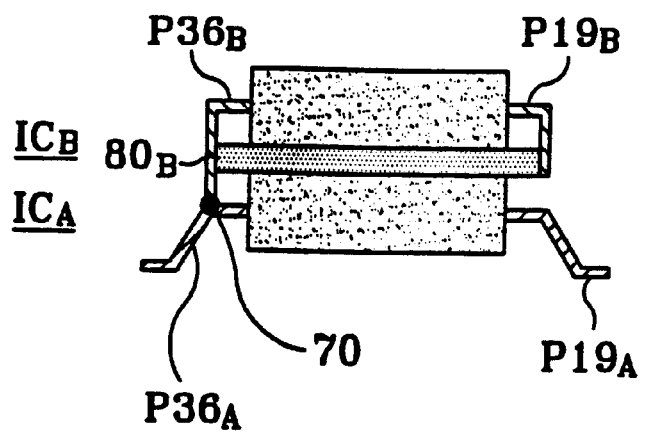

FIGS. 5A to 5C show a stacked package formed by inserting a connection board onto the rear surface of the upper semiconductor package, and directly connecting respective leads. FIG. 5A is a rear view of an upper semiconductor package $IC_B$ in which a connection board is inserted. FIG. 5B is a perspective view of a stack package stacked using the upper semiconductor package of FIG. 5A. FIG. 5C is a cross-sectional view of the stacked package of FIG. 5B taken along a line u–u'.

The internal and external structures of the semiconductor package $IC_B$ shown in FIG. 5A are the same as those of the lower semiconductor package $IC_A$ of FIG. 2C. Thus, the 15th lead of the semiconductor package $IC_B$ is a lead which is not connected to a die inside the package, and the 19th lead is a lead which is connected to a CS pad of the die.

As shown in FIGS. 5A to 5C, this embodiment provides a stacked package formed by inserting a connection board $80_B$ onto the rear surface of the upper semiconductor package $IC_B$, and directly connecting between respective leads for the operation of the stacked package. A connection wire $85_B$ is printed on the connection board $80_B$ so that the 15th lead and the 19th lead are electrically connected inside the connection board $80_B$. Furthermore, as described above, since the length of the 19th lead is shortened during a stacking process and disconnected from the 19th CS lead of the lower semiconductor package, the 15th lead of the upper semiconductor package $IC_B$ which was a NC lead in the typical 64M SDRAM substitutes the function of the CS lead. The functions and executions of the remaining leads except for the 15th and 19th leads are same as those described above.

Figure 6A:
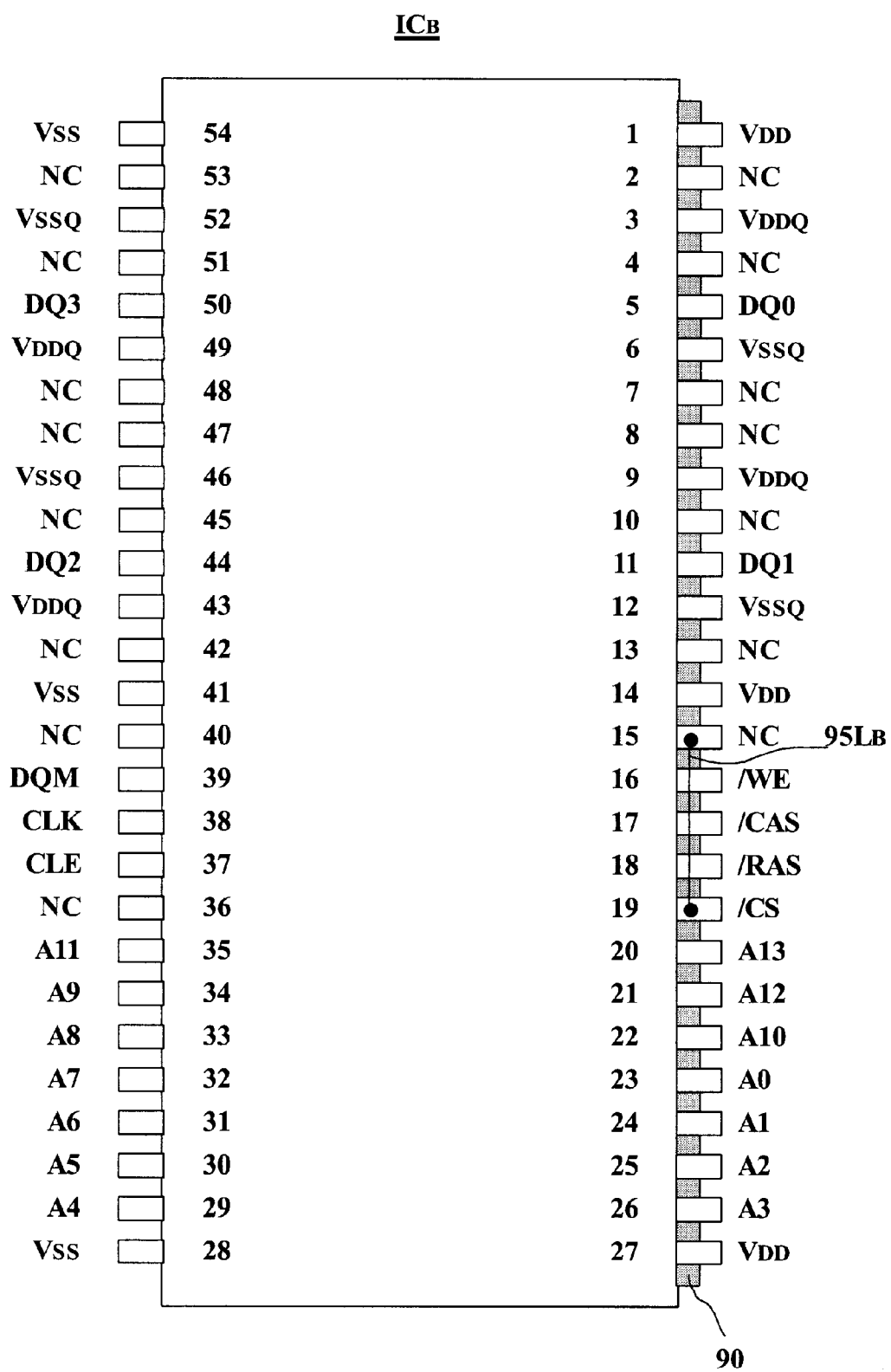
FIGS. 6A to 6C show a stacked package formed by inserting an auxiliary connection-bar between a body end portion of the upper semiconductor package $IC_B$ and the leads thereof.
Figure 6B:
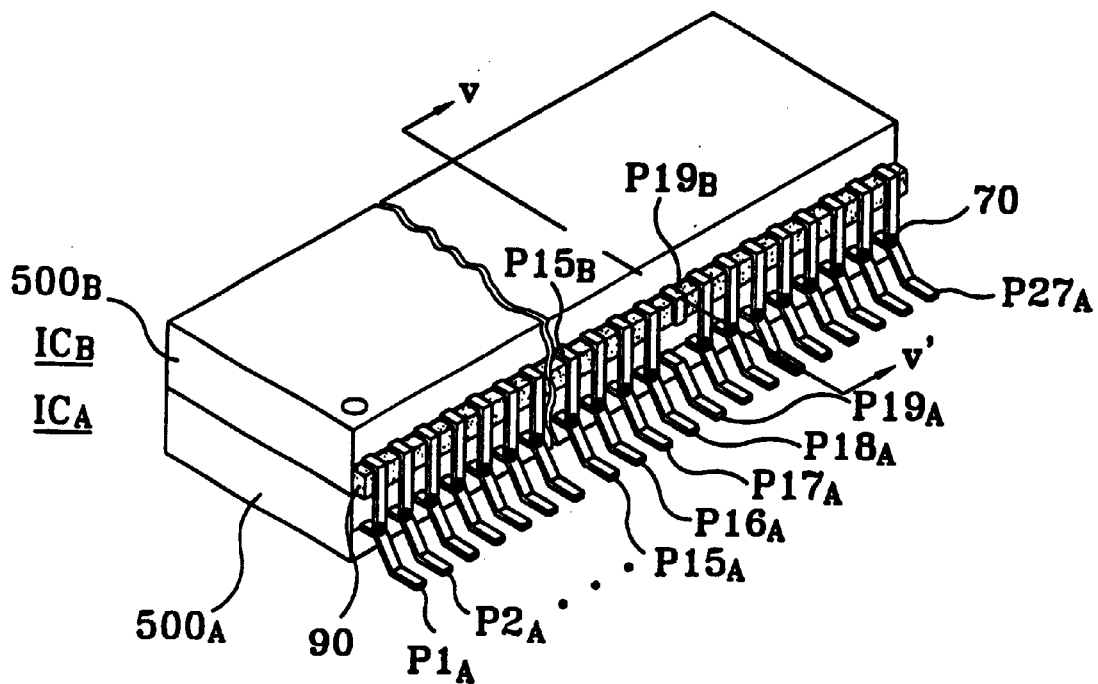
Figure 6C:
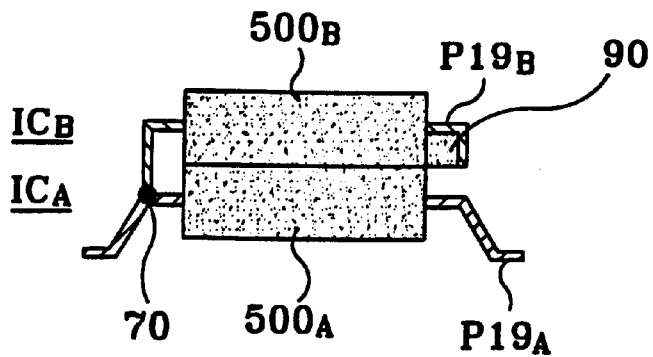

FIGS. 6A to 6C show still another embodiment in which an external connection portion of a CS lead and an external connection portion of a NC lead are connected externally outside of the package molding compound body for the purpose of the operation of a stacked package. An auxiliary connection bar is inserted in the space between the package body end and the leads of the upper semiconductor package. Then, respectively corresponding leads are directly connected at the state of disconnecting the CS lead of the upper semiconductor package and the CS lead of the lower semiconductor package, to thus form a stacked package.

FIG. 6A is a rear view of an upper semiconductor package $IC_B$ in which an auxiliary connection bar $95L_B$ is inserted between a body end portion of the package and the leads thereof. FIG. 6B is a perspective view of the stacked package in which the respectively corresponding leads are directly connected using the upper semiconductor package of FIG. 6A. FIG. 6C is a sectional view of the stacked package of FIG. 6B taken along a line v–v'.

In the stacked package of the embodiment as shown in FIGS. 6A to 6C, an auxiliary connection bar 90 for connecting between a CS lead and a NC lead is inserted in a space between a body end portion of the upper semiconductor package $IC_B$ and a number of leads $P1_B$–$P27_B$ thereof. The respective leads of the upper semiconductor package $IC_B$ are directly connected by a soldering at the point denoted by a reference numeral 70, in correspondence to the respective leads of the lower semiconductor package $IC_A$.

Thus, as described above, since the length of the 19th lead $P19_B$ of the upper semiconductor package $IC_B$ is shortened and disconnected from the 19th lead $P19_A$ of the lower semiconductor package $IC_A$ during a stacking process, the 15th lead $P15_A$ of the upper semiconductor package $IC_A$ which is to be mounted to an external circuit or circuit-board performs a CS lead function for the purpose of the operation of the upper semiconductor package $IC_B$. The auxiliary connection bar 90 which externally connects with its conduction layer between the CS lead and a particular NC lead is fabricated in the form of a rectangular shape or a "⊏" shape other than a straight bar, to thereby connect between the CS lead and the NC leads located opposite side, to fit the space between the package body end and the package leads. The length of the auxiliary connection bar 90 is adjusted as needed, to effectively form a stacked package.

In the case when a number of semiconductor package units are stacked differently from the above-described embodiments, respective semiconductor packages stacked above the lowermost semiconductor package $IC_A$ connect the CS leads of the respective semiconductor packages with the NC leads located at different positions among a number of NC leads of the semiconductor packages and electrically disconnecting between the CS leads of the semiconductor package stacked at relatively lower positions, to thereby effectively form a stacked package using a number of semiconductor packages.

Figure 7A:
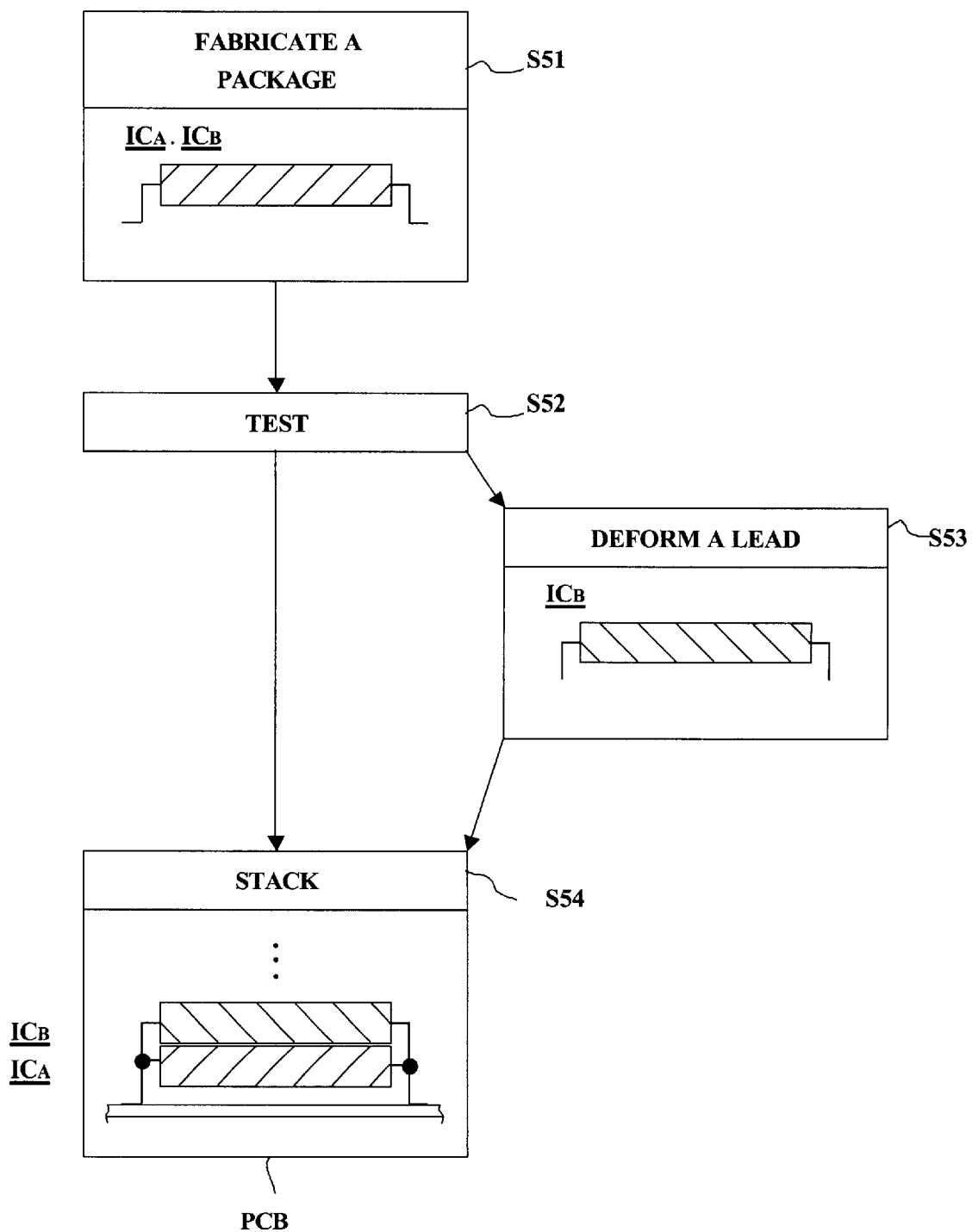
FIGS. 7A to 7B show a stacking method of semiconductor package units through direct connection between leads according to the present invention.
Figure 7B:
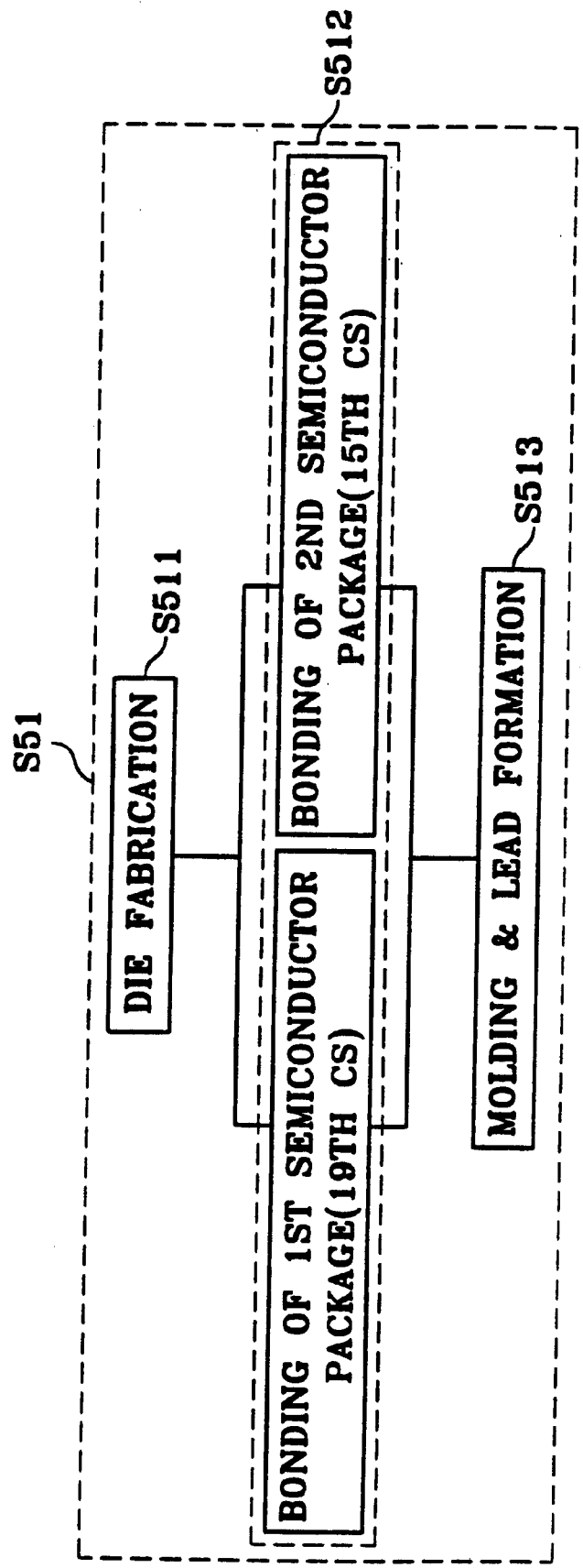

FIGS. 7A to 7B show a stacking method of semiconductor package units according to the present invention.

As shown in FIG. 7A, the stacking method according to the present invention can be largely divided into four steps. A package fabrication step S51 is a step for fabricating a semiconductor package which is used for forming a stacked package. In the package fabrication step S51, a conventional semiconductor package without having changed in a wire bonding and/or, as needed, a semiconductor package having changed in the wire bonding are fabricated. The fabricated semiconductor packages $IC_A$ and $IC_B$ pass through a testing step S52 for testing and examining whether the fabricated semiconductor packages perform inherent functions. Then, a certain number of semiconductor packages $IC_B$ stacked one on top of another pass through a lead deformation step S53 for deforming a lead. Finally, in a stacking step S54, a certain number of semiconductor packages $IC_B$ with a deformed lead are stacked above the semiconductor package $IC_A$ having a lead which was not deformed.

FIG. 7B shows a package fabrication step S51 of FIG. 7A in detail, in the case of special wire-bonding packages. Referring to FIG. 7B, the stacking method of the present invention will be described in more detail. A conventional semiconductor package having a wire bonding which is not changed as well as a semiconductor package having a changed wire-bonding as depicted in FIG. 2E and FIG. 4E etc, is fabricated in the package fabrication step S51. However, the fabricated semiconductor packages have the same leads in their shape irrespective of the wire-bonding change in the package fabrication step S51.

A first step of the package fabrication step S51 is a die fabrication step S511 for fabricating a die. A die means an integrated circuit performing a substantial function of a semiconductor package on a wafer. A bonding step S512 is a step for changing a wire bonding connecting a die to a lead frame. Thus, the connection of the inner connection bonding-wires of the CS lead can be changed. As described in the FIG. 2E embodiment, it is possible to connect a 15th lead to a CS pad in place of a 19th lead. Also, as shown in FIGS. 4A and 4B, it is possible to perform doubly wire bonding. Thereafter, a molding and lead formation step S513 for forming outer connection portions of leads by molding with a molding compound is performed, to thereby complete a semiconductor package unit.

A semiconductor package fabricated and completed in the form of a package passes through the testing step S52. The step S52 discriminates whether a completed semiconductor package is normal. The lead deformation step S53 for deforming the leads in order to stack a certain number of the semiconductor packages which have been discriminated as normal is performed. That is, the lead deformation step S53 straightens the leads, leaving the leads in the shape of a conventional DIP lead in order to be easily stacked. Also, in the case that a connection board or an auxiliary connection bar is used as described in the FIGS. 5A and 6A embodiments, the lead deformation step S53 inserts the connection board or the auxiliary connection bar therein and adjusts the length of the CS lead taking the state to be stacked in the stacking step S54 into consideration.

At the stacking step S54, the respective leads of the lower semiconductor package $IC_A$ are directly connected to the respectively corresponding leads of the upper semiconductor package $IC_B$, to form a stacked package. In the above-described embodiments, the change in the wire bonding with respect to the inner die and the connection change in the particular lead outside the package using the connection board are for the operation of the stacked package.

Thus, the present invention does not use the separate means of the prior art, and connects directly between respectively corresponding predetermined leads of the upper semiconductor package and the lower semiconductor package considering the operation of the stacked package to be completed, to thereby provide an effect for effectively stacking a number of semiconductor packages.

What is claimed is:

1. A stack method for stacking a plurality of semiconductor chips to form a stacked semiconductor package, the stack method comprising the steps of:
    (a) stacking said plurality of semiconductor chips such that each data and power lead of an upper semiconductor chip is directly above and connected to a corresponding data and power lead of a lower semiconductor chip;
    (b) deforming a control lead of one of said stacked chips to disconnect said control lead from a corresponding control lead of a second of said stacked chips; and
    (c) connecting said deformed control lead to a non-functioning lead with a connection bar.

2. The stack method according to claim 1, wherein said connecting step (c) further comprises step of inserting said connection bar between said one and said second of said stacked chips.

3. The stack method according to claim 1, wherein said connecting step (c) further comprises step of inserting said connection bar between a molding compound body and a plurality of leads of said one of said stacked chips, said connection bar having a connection wire for electrically connecting said deformed control lead to said non-functioning lead of said one of said stacked chips.

4. The stack method according claim 1, wherein said stacking step further includes straightening said data and power leads of said one of said stacked chips to connect with corresponding data and power leads of said second of said stacked chips.

5. The stack method according to claim 4, wherein said step of stacking includes step of directly connecting said data and power leads of said upper semiconductor chip with said corresponding leads of said lower semiconductor chip by soldering.

6. The stack method of claim 2, wherein said connection bar includes a connection wire electrically connecting said deformed control lead to said non-functioning lead.

7. The stack method of claim 1, wherein said deformed control lead is a chip select pin for selecting data pins of said one of said stacked chips for inputting and outputting, said chip select pin receiving select signals via said non-functioning lead of said second of said stacked chips and said connection bar.

8. A semiconductor package having a plurality of stacked semiconductor chips, comprising:
    a first and second semiconductor chip having identical chip size and identical power and data pinouts, said second semiconductor chip positioned directly on top of said first semiconductor chip so that said power and data pinouts of said second chip is directly on top of and connected to corresponding power and data pinouts of said first chip; and a control pin of said second chip, being deformed and disconnected from a control pin of said first chip directly underneath, said deformed pin being connected to a no-connection (NC) pin of said second chip by a connection bar.

9. The semiconductor package of claim 8, wherein layout of pinouts of said first semiconductor chip is identical to the layout of said second semiconductor chip.

10. The semiconductor package of claim 9, wherein said first and second semiconductor chips are oriented in a same upright position.

* * * * *